US012686914B2

(12) United States Patent　　(10) Patent No.:　US 12,686,914 B2
Narushima et al.　　　　　　　　(45) Date of Patent:　　　Jul. 21, 2026

(54) METHOD AND DEVICE FOR FORMING TUNGSTEN FILM, AND DEVICE FOR FORMING INTERMEDIATE FILM BEFORE FORMING TUNGSTEN FILM

(71) Applicant: Tokyo Electron Limited, Tokyo (JP)

(72) Inventors: Kensaku Narushima, Nirasaki City (JP); Takanobu Hotta, Nirasaki City (JP); Takuya Kawaguchi, Nirasaki City (JP)

(73) Assignee: Tokyo Electron Limited, Tokyo (JP)

( * ) Notice: Subject to any disclaimer, the term of this patent is extended or adjusted under 35 U.S.C. 154(b) by 828 days.

(21) Appl. No.: 17/995,937

(22) PCT Filed: Apr. 5, 2021

(86) PCT No.: PCT/JP2021/014521
§ 371 (c)(1),
(2) Date: Oct. 11, 2022

(87) PCT Pub. No.: WO2021/210441
PCT Pub. Date: Oct. 21, 2021

(65) Prior Publication Data
US 2023/0212738 A1　　Jul. 6, 2023

(30) Foreign Application Priority Data
Apr. 15, 2020　(JP) ................................. 2020-073099

(51) Int. Cl.
*C23C 16/02*　　(2006.01)
*C23C 16/08*　　(2006.01)
(Continued)

(52) U.S. Cl.
CPC .......... *C23C 16/0272* (2013.01); *C23C 16/08* (2013.01); *C23C 16/34* (2013.01);
(Continued)

(58) Field of Classification Search
CPC ..... C23C 16/02; C23C 16/0272; C23C 16/08; C23C 16/14; C23C 16/279; C23C 16/34;
(Continued)

(56) References Cited

U.S. PATENT DOCUMENTS

2015/0279735 A1* 10/2015 Hotta ...................... C23C 16/14
　　　　　　　　　　　　　　　　　　　427/255.392
2017/0194204 A1*　7/2017 Sowa ................ H01L 21/76846

FOREIGN PATENT DOCUMENTS

JP　　2015-231025 A　12/2015
JP　　2016-186094 A　10/2016
(Continued)

*Primary Examiner* — Brook Kebede
(74) *Attorney, Agent, or Firm* — Armstrong Teasdale LLP

(57) ABSTRACT

The formation of a tungsten film is promoted when forming the tungsten film using tungsten chloride on an upper layer side of a titanium silicon nitride film. A titanium silicon nitride film is formed on one surface side of a semiconductor wafer as a substrate, and an intermediate film for promoting the formation of the tungsten film made of the tungsten chloride is formed on the upper layer side of the titanium silicon nitride film by using a gas for forming the intermediate film. The tungsten film is formed on an upper layer side of the intermediate film by using a gas of the tungsten chloride.

2 Claims, 10 Drawing Sheets

(51) Int. Cl.

| | | |
|---|---|---|
| *C23C 16/34* | (2006.01) | |
| *C23C 16/455* | (2006.01) | |
| *C23C 16/52* | (2006.01) | |
| *H10P 14/40* | (2026.01) | |
| *H10W 20/00* | (2026.01) | |

(52) U.S. Cl.
CPC ........ *C23C 16/45527* (2013.01); *C23C 16/52* (2013.01); *H10P 14/412* (2026.01); *H10W 20/045* (2026.01)

(58) Field of Classification Search
CPC ............ C23C 16/45527; C23C 16/455; C23C 16/45557; C23C 16/52; H01L 21/3205; H01L 21/32051; H01L 21/28; H01L 21/28088; H01L 21/285; H01L 21/28518; H01L 21/28537; H01L 21/28556; H01L 21/28562; H01L 21/28568; H01L 21/768; H01L 21/7685; H01L 21/76876; H01L 23/532; H01L 23/53266; H10P 14/421; H10W 20/045
See application file for complete search history.

(56) References Cited

FOREIGN PATENT DOCUMENTS

| | | |
|---|---|---|
| JP | 2019-031746 A | 2/2019 |
| KR | 10-2004-0107842 A | 12/2004 |
| KR | 10-2015-0111302 A | 10/2015 |
| KR | 10-2016-0115781 A | 10/2016 |

* cited by examiner

| Steps | 1 | 2 | 3 | 4 |
|---|---|---|---|---|
| $WCl_5$ | → | | | |
| $N_2$ | | → | | → |
| $H_2$ | | | → | |
| Additional $H_2$ | → | | | → |
| Constant $N_2$ | → | | | → |

FIG. 7

| Steps | 1 | 2 | 3 | 4 | 5 | 6 | 7 | 8 |
|---|---|---|---|---|---|---|---|---|
| $WCl_5$ | ↑ | | | | ↑ | | | |
| $N_2$ | | ↑ | | ↑ | | ↑ | | ↑ |
| $H_2$ | | | ↑ | | | | ↑ | |
| Additional $H_2$ | | | | | | | | ↑ |
| Constant $N_2$ | | | | | | | | ↑ |

METHOD AND DEVICE FOR FORMING TUNGSTEN FILM, AND DEVICE FOR FORMING INTERMEDIATE FILM BEFORE FORMING TUNGSTEN FILM

CROSS-REFERENCE TO RELATED APPLICATIONS

The present application is a U.S. National Stage Entry of International Patent Application No. PCT/JP2021/014521, filed Apr. 5, 2021, which claims the benefit of priority to Japanese Patent Application No. 2020-073099, filed Apr. 15, 2020, each of which is hereby incorporated herein by reference in its entirety.

TECHNICAL FIELD

The present disclosure relates a method and apparatus for forming a tungsten film, and an apparatus for performing the formation of an intermediate film before forming the tungsten film.

BACKGROUND

A metal oxide semiconductor field effect transistor (MOS-FET), which is an example of a semiconductor device, is configured by sequentially laminating an oxide film, a gate metal, and a metal wiring layer from a lower side in a gate region on a silicon substrate. The present inventors have developed a technique of using a titanium silicon nitride film as a gate metal and forming a tungsten film as a wiring layer thereon.

Patent Document 1 proposes a method of forming a tungsten film on a surface of a substrate by repeating a cycle of alternately supplying a tungsten chloride gas and a hydrogen gas.

PRIOR ART DOCUMENT

Patent Document

Patent Document 1: Japanese laid-open publication No. 2019-031746

The present disclosure provides a technique capable of promoting the formation of a tungsten film when forming the tungsten film using tungsten chloride on an upper layer side of a titanium silicon nitride film.

SUMMARY

The present disclosure relates to a method of forming a tungsten film on a substrate, wherein the method includes operations of: forming, on an upper layer side of a titanium silicon nitride film formed on one surface side of the substrate, an intermediate film for promoting the formation of the tungsten film using tungsten chloride; and forming the tungsten film on an upper layer side of the intermediate film by using a gas of the tungsten chloride.

According to the present disclosure, it is possible to promote the formation of a tungsten film when forming the tungsten film using tungsten chloride film on the upper layer side of a titanium silicon nitride film.

BRIEF DESCRIPTION OF DRAWINGS

FIG. 7 is a view illustrating an example of the gas supply sequence in the film forming method according to the second embodiment.

DETAILED DESCRIPTION

Figure 1:
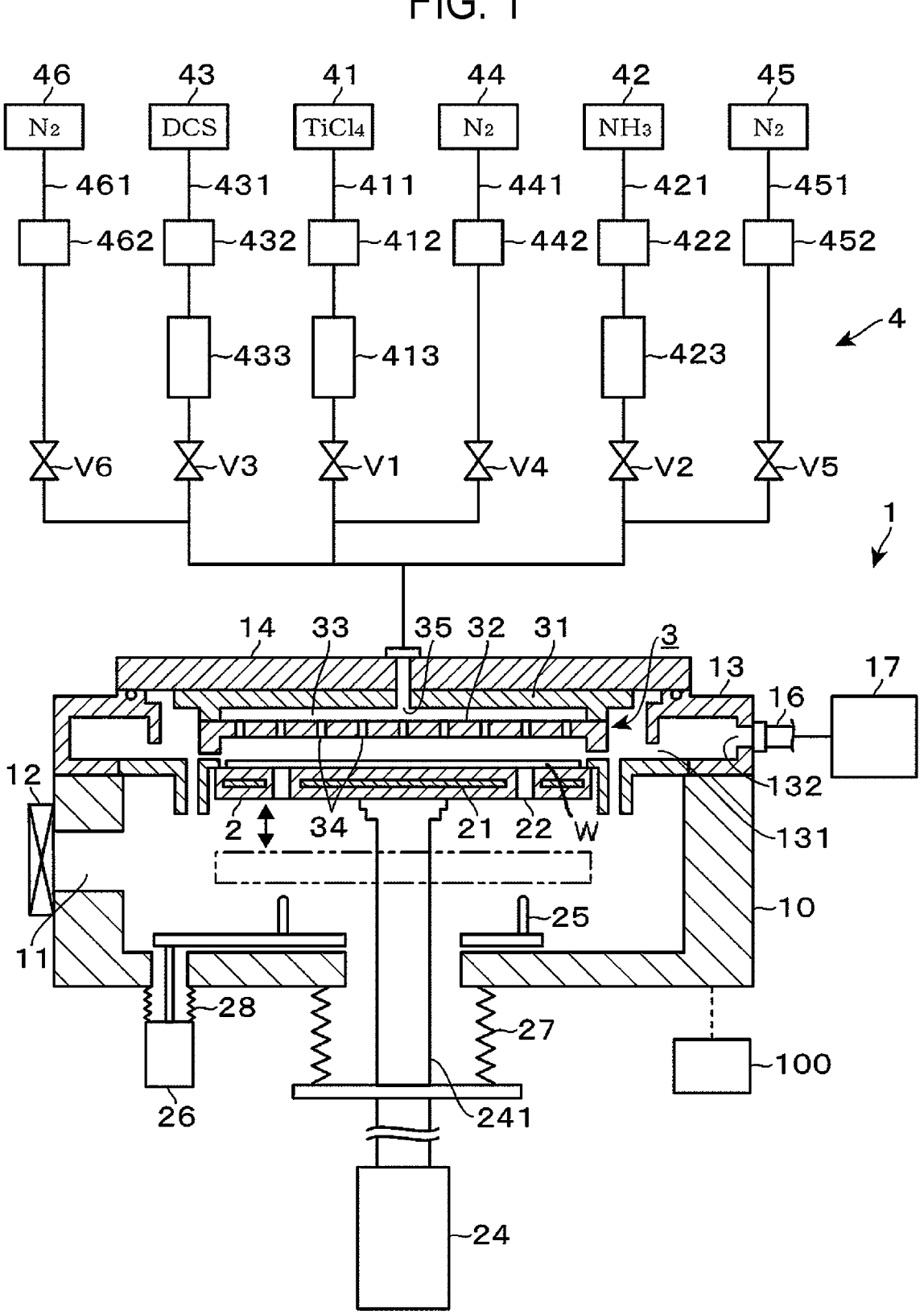
FIG. 1 is a vertical cross-sectional side view illustrating an example of an intermediate film forming apparatus of the present disclosure.

The present disclosure relates to a technique for promoting the formation of a tungsten film when forming the tungsten film using tungsten chloride on an upper layer side of a titanium silicon nitride film (TiSiN film) formed on one surface side of a semiconductor wafer as a substrate. The present inventors have obtained a new knowledge that, when a tungsten film is formed on the upper layer side of the TiSiN film by using a tungsten chloride gas, poor film formation may be easily caused since the tungsten film is not likely to grow, and have made the present disclosure to solve this problem.

First Embodiment

In this embodiment, an intermediate film is formed on the upper layer side of the TiSiN film before forming the tungsten film. The intermediate film is a film for promoting the formation of the tungsten film made of the tungsten chloride, and is configured with a titanium nitride film (TiN film) in this example. An embodiment of an apparatus for forming this intermediate film (hereinafter, referred to as "first film forming apparatus") will be described with reference to FIG. 1.

A first film forming apparatus 1 includes a processing container 10 that accommodates therein a wafer W. A carry-in/out port 11 for carrying in or carrying out the wafer W is provided in the sidewall of the processing container 10 and is openable/closable by a gate valve 12. For example, an annular exhaust duct 13, which includes a slit 131 formed along the inner peripheral surface thereof and an exhaust port 132 formed in the outer wall thereof, is provided on the sidewall of the processing container 10. On the top surface of the exhaust duct 13, a ceiling wall 14 is provided so as to close an upper opening of the processing container 10. The processing container 10 is connected by an evacuation path 16 to a vacuum evacuation part 17 including, for example, a vacuum pump, via an exhaust port 132. An internal the pressure of the processing container 10 is controlled by a pressure controller (not illustrated).

A stage 2 for horizontally supporting the wafer W is provided inside the processing container 10. A heater 21 for heating the wafer W is embedded in the stage 2. The stage 2 is configured to be vertically movable between a processing position illustrated in FIG. 1 and a delivery position for the wafer W indicated by an alternated long and short dash line below the processing position by a lifting mechanism 24 via a support member 241. Three support pins 25 (of which only two are illustrated) for delivering the wafer W are provided below the stage 2 inside the processing container 10. These support pins 25 are provided to be vertically movable by a lifting mechanism 26 to move upward/downward with respect to the top surface of the stage 2 at the delivery position. In the figure, reference numeral 22 indicates through-holes for the support pins 25, and reference numerals 27 and 28 indicate bellows that isolates an internal atmosphere of the processing container 10 from ambient air and to be flexible with the vertical movement of the stage 2 and the support pins 25, respectively.

The processing container 10 is provided with a shower head 3 for supplying a processing gas into the processing container 10 in the form of a shower while facing the stage 2. The shower head 3 includes a main body 31 fixed to the ceiling wall 14 of the processing container 10 and a shower plate 32 connected under the main body 31. The interior of the shower head 3 forms a gas diffusion space 33. Gas ejection holes 34 are formed in the shower plate 32. A gas supply system 4 is connected to the gas diffusion space 33 via a gas introduction hole 35.

The gas supply system 4 includes an intermediate-film forming gas supply part for supplying an intermediate-film forming gas to the processing container 10. The intermediate-film forming gas is a gas for forming an intermediate film. The intermediate film in this example is a TiN film, and the intermediate-film forming gas supply part includes a titanium-containing gas supply part that supplies a titanium-containing gas and a nitrogen-containing gas supply part that supplies a nitrogen-containing gas. In this example, a titanium tetrachloride (TiCl$_4$) gas is used as the titanium-containing gas, and an ammonia (NH$_3$) gas is used as the nitrogen-containing gas.

The titanium-containing gas supply part includes a TiCl$_4$ source 41 and a gas supply path 411. For example, the gas supply path 411 is provided with a flow rate regulator 412, a storage tank 413, and a valve V1 from the upstream side. In addition, the nitrogen-containing gas supply part includes a NH$_3$ source 42 and a gas supply path 421. For example, the gas supply path 421 is provided with a flow rate regulator 422, a storage tank 423, and a valve V2 from the upstream side.

In addition, the first film forming apparatus 1 of this example is configured to be able to form a TiSiN film, which is formed on a lower layer side of the intermediate film. As will be described later, the TiSiN film is formed by laminating a TiN film and a silicon nitride film (SiN film). The gas supply system 4 further includes a silicon-containing gas supply part for supplying a silicon-containing gas, which is a raw material of the SiN film, to the processing container 10. In this example, a dichlorosilane (SiH$_2$Cl$_2$: DCS) gas is used as the silicon-containing gas. The silicon-containing gas supply part includes a DCS source 43 and a gas supply path 431. For example, the gas supply path 431 is provided with a flow rate regulator 432, a storage tank 433, and a valve V3 from the upstream side.

The TiCl$_4$ gas, the NH$_3$ gas, and the DCS gas are temporarily stored in the storage tanks 413, 423, and 433, respectively, and supplied into the processing container 10 after being boosted to a predetermined pressure in the respective storage tanks. The supply and cutoff of the respective gases from the storage tanks 413, 423, and 433 to the processing container 10 are performed by opening and closing the valves V1, V2, and V3.

In addition, the gas supply system 4 includes sources 44, 45, and 46 of an inert gas such as a nitrogen (N$_2$) gas. In this example, the N$_2$ gas supplied from the source 44 is a purge gas for TiCl$_4$. The source 44 is connected to the downstream side of the valve V1 in the gas supply path 411 for the TiCl$_4$ gas via the gas supply path 441. In addition, the N$_2$ gas supplied from the source 45 is a purge gas for NH$_3$. The source 45 is connected to the downstream side of the valve V2 in the gas supply path 421 for the NH$_3$ gas via the gas supply path 451. The N$_2$ gas supplied from the source 46 is a purge gas for DCS. The source 46 is connected to the downstream side of the valve V3 in the gas supply path 431 for DCS gas via a gas supply path 461. In FIG. 1, reference numerals 442, 452, and 462 indicate flow rate regulators, respectively, and reference numerals V4, V5, and V6 indicate valves, respectively.

The first film forming apparatus 1 includes a controller 100. The controller 100 is configured with, for example, a computer, and includes a data processor including a program, a memory, and a CPU. The program incorporates commands (respective steps) to cause the controller 100 to send control signals to each part of the first film forming apparatus 1 and execute a film forming process of the intermediate film to be described later. The program is stored in a storage part, such as a non-transitory computer-readable storage medium, for example, a flexible disk, a compact disk, a hard disk, a magneto-optical disk (MO), or the like, and is installed in the controller 100.

Specifically, the controller 100 is configured to execute the step of supplying a raw-material gas for a TiSiN film to the processing container 10 which accommodates the wafer W to form a TiSiN film on one surface side of the wafer W. Thereafter, the controller 100 is configured to perform a control to execute the step of supplying an intermediate-film forming gas to the processing container 10 to form the intermediate film on the upper layer side of the TiSiN film. In addition, the controller 100 is configured to perform a control to switch and supply various gases based on a gas supply sequence (to be described later) when forming the TiSiN film or the intermediate film.

Figure 2:
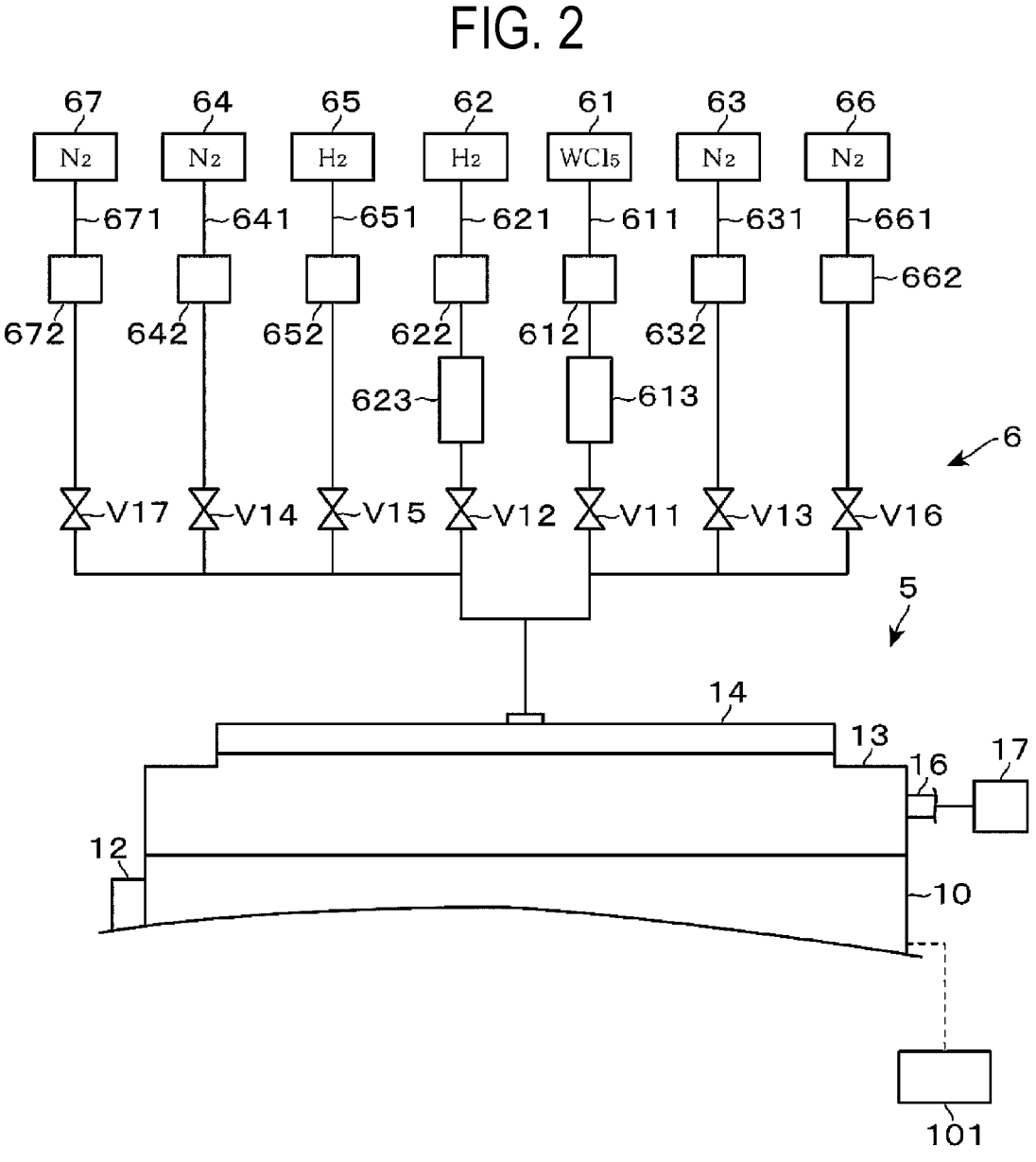
FIG. 2 is a configuration view illustrating a gas supply system of a tungsten film forming apparatus of the present disclosure.

Next, an embodiment of an apparatus for forming a tungsten film (hereinafter, referred to as a "second film forming apparatus") on the upper layer side of the intermediate film formed on one surface side of the wafer W will be described with reference to FIG. 2. Constituent members of the second film forming apparatus 5 are configured to be similar to those of the first film forming apparatus 1 illustrated in FIG. 1, except for the gas supply system. Here, the descriptions of the similar constituent members will be omitted, and a gas supply system 6 and the controller 101 will be described.

The gas supply system 6 includes a tungsten chloride supply part for supplying a tungsten chloride gas to the processing container 10 and a hydrogen supply part. In this example, tungsten pentachloride (WCl$_5$) is used as the tungsten chloride. The tungsten chloride supply part includes a WCl$_5$ source 61 and a gas supply path 611. The gas supply path 611 is provided with a flow meter 612, a storage tank 613, and a valve V11 from the upstream side.

WCl$_5$ is solid at room temperature. For example, the source 61 includes a raw material tank (not illustrated) that accommodates the solid WCl$_5$, is heated by a heater, and is supplied with a carrier gas, for example, a N$_2$ gas. The gas supply system is configured to sublimate WCl$_5$ inside the raw material tank by heating with the heater, supply the carrier gas into the raw material tank, and send the sublimated WCl$_5$ gas to the gas supply path 611 together with the carrier gas. Thus, a mixed gas of the WCl$_5$ gas and the carrier gas is supplied from the WCl$_5$ source 61 to the processing container 10 via the gas supply path 611. As the tungsten chloride, tungsten tetrachloride (WCl$_4$), tungsten hexachloride (WCl$_6$), or the like may be used. These WCl$_4$ and WCl$_6$ are also solid at room temperature. Thus, sources of WCl$_4$ and WCl$_6$, and the like are similarly configured.

The hydrogen supply part supplies hydrogen (H$_2$) to the processing container 10 for reducing tungsten chloride to form a tungsten film. The hydrogen supply part includes a source 62 and a gas supply path 621. The gas supply path 621 is provided with a flow rate regulator 622, a storage tank 623, and a valve V12 from the upstream side. The WCl$_5$ gas and the H$_2$ gas are temporarily stored in the storage tanks 613 and 623, respectively, boosted to a predetermined pressure inside the storage tanks, and then supplied into the processing container 10. The supply and cutoff of respective gases from the storage tanks 613 and 623 to the processing container 10 are performed by opening and closing the valves V11 and V12.

In addition, the gas supply system 6 includes sources 63 and 64 of an inert gas such as a nitrogen (N$_2$) gas. In this example, the N$_2$ gas supplied from the source 63 is a purge gas for WCl$_5$. The source 63 is connected to the downstream side of the valve V11 in the gas supply path 611 for the WCl$_5$ gas via a gas supply path 631. In addition, the N$_2$ gas supplied from the source 64 is a purge gas for H$_2$. The source 64 is connected to the downstream side of the valve V12 in the gas supply path 621 for the H$_2$ gas via a gas supply path 641.

In addition, the N$_2$ gas supplied from a source 66 is a gas that is constantly supplied into the processing container 10 in order to prevent backflow of WCl$_5$ from the processing container 10 to the gas supply path 611. The source 66 is connected to the downstream side of the valve V11 in the gas supply path 611 via a gas supply path 661. In addition, the N$_2$ gas supplied from a source 67 is a gas that is constantly supplied into the processing container 10 in order to prevent backflow of the H$_2$ gas from the processing container 10 to the gas supply path 621. The source 67 is connected to the downstream side of the valve V12 in the gas supply path 621 via a gas supply path 671.

The gas supply system 6 in this example includes a source 65 of a H$_2$ gas that is constantly supplied to the processing container 10 during a film forming process, which will be described later. This source 65 is connected to the downstream side of the valve V12 in the gas supply line 621 for the H$_2$ gas for reduction of WCl$_5$ via a gas supply line 651. In FIG. 2, reference numerals 632, 642, 652, 662, and 672 indicate flow rate regulators, respectively, and reference numerals V13, V14, V15, V16, and V17 indicate valves, respectively.

The second film forming apparatus 5 includes a controller 101 configured similarly to the controller 100 of the first film forming apparatus 1. The program of the controller 101 incorporates commands (respective steps) to send control signals to each part of the second film forming apparatus 5 and perform a tungsten film forming process, which will be described later. Specifically, the controller 101 is configured to perform a control to form a tungsten film by alternately supplying the WCl$_5$ gas and the H$_2$ gas to the processing container 10. The controllers 100 and 101 of the first and second film forming apparatuses 1 and 5 may be shared.

For example, each of the first film forming apparatus 1 and the second film forming apparatus 5 is airtightly connected to a vacuum transfer chamber in which a transfer mechanism is installed, and is configured such that the wafer W is transferred between the first film forming apparatus 1 and the second film forming apparatus 5 by the transfer mechanism via the vacuum transfer chamber.

Figure 3:
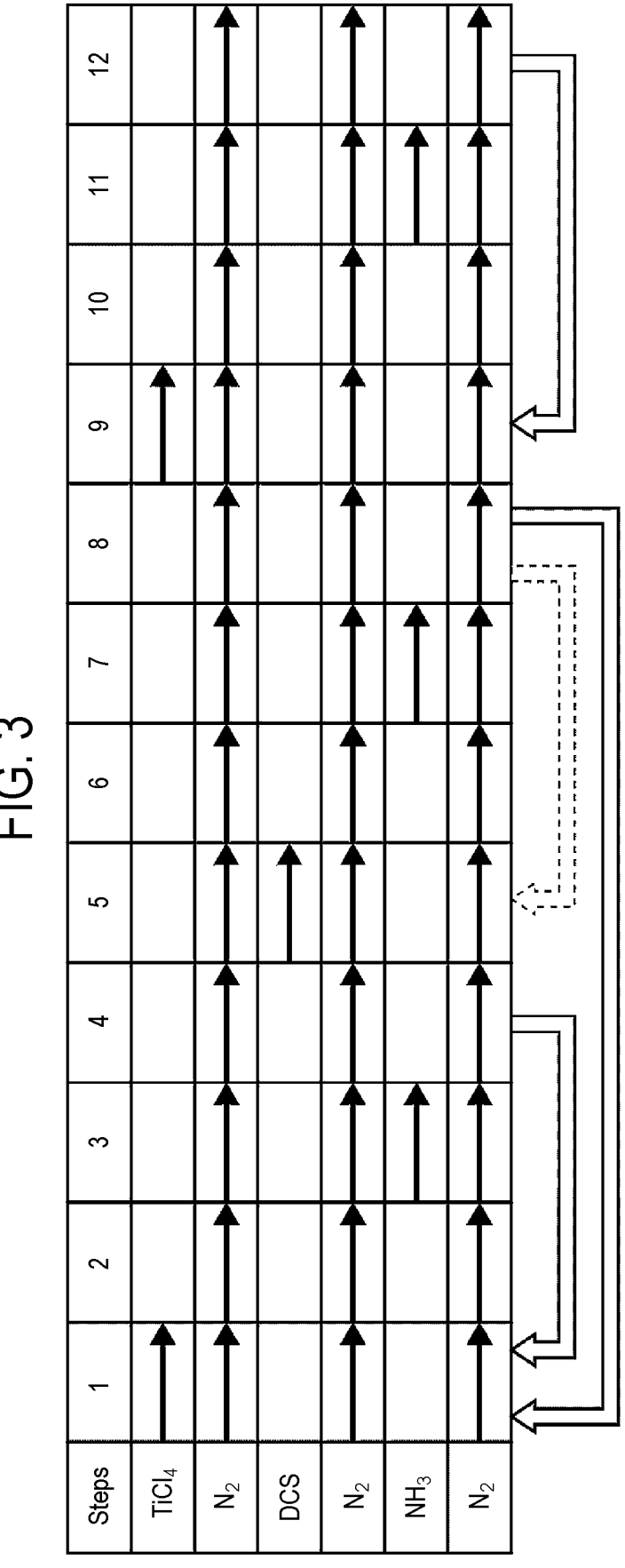
FIG. 3 is a view illustrating an example of a gas supply sequence in a film forming method according to a first embodiment.

Next, an example of a film forming method of the present disclosure will be described with reference to the gas supply sequence of FIG. 3. In this example, in the first film forming apparatus 1, a TiSiN film is first formed on one surface side of the wafer W by an atomic layer deposition (ALD) method. A TiN film as an intermediate film is formed on the upper layer of the TiSiN film by the ALD method. The gas supply sequence of FIG. 3 illustrates supply timings of the TiCl$_4$ gas, the DCS gas, the NH$_3$ gas used for film formation, and the N$_2$ gas, which is a purge gas for these gases, to the processing container 10. In FIG. 3, N$_2$ below TiCl$_4$ is the N$_2$ gas supplied from the source 44, N$_2$ below DCS is the N$_2$ gas supplied from the source 46, and N$_2$ below NH$_3$ is the N$_2$ gas supplied from the source 45.

First, a film forming process of the TiSiN film will be described. The wafer W is carried into the processing container 10 and placed on the stage 2. The heating of the wafer W by the heater 21 is initiated, and the interior of the processing container 10 is evacuated by the vacuum evacuation part 17. The N$_2$ gas is constantly supplied to the processing container 10 from the sources 44, 45 and 46 during the film forming processes of the TiSiN film and the intermediate film, which will be described later.

Thereafter, based on the gas supply sequence of FIG. 3, first, the TiCl$_4$ gas is supplied to be adsorbed on the wafer W (step 1). Subsequently, purging with the N$_2$ gas is performed to remove the TiCl$_4$ gas remaining in the processing container 10 (step 2). Subsequently, the NH$_3$ gas is supplied to react with the TiCl$_4$ adsorbed on the wafer W to form a TiN film (step 3). Subsequently, purging with the N$_2$ gas is performed to remove the NH$_3$ gas remaining in the processing container 10 (step 4). In this way, steps 1 to 4 are repeated a set number of times to form a TiN film having a desired thickness.

Subsequently, after the DCS gas is supplied and adsorbed on the wafer W (step 5), purging with the N$_2$ gas is performed to remove the DCS gas remaining in the processing container 10 (step 6). Subsequently, the NH$_3$ gas is supplied to react with the DCS adsorbed on the wafer W to form a SiN film (step 7). Subsequently, purging with the N$_2$ gas is performed to remove the DCS gas remaining in the processing container 10 (step 8). In this way, steps 5 to 8 are repeated once or a set number of times to form a SiN film having a desired thickness.

In this example, steps 1 to 4 are repeated 19 times to form the TiN film, and steps 5 to 8 are performed once to form the SiN film on the TiN film. Then, steps 1 to 4 are repeated 19 times again to form a TiN film on the SiN film, and steps 5 to 8 are performed once to form a SiN film on the TiN film. In this way, for example, a TiSiN film having a thickness of 27 Å and a silicon (Si) content of 5 atom % is formed.

In the TiN film forming operation and the SiN film forming operation, film formation proceeds so that respective nuclei grow and spread. Therefore, a surface after forming the SiN film on the TiN film is in a state in which titanium (Ti), silicon (Si), and nitrogen (N) are mixed. A film in such a state is called a TiSiN film. As described above, the TiSiN film is formed by laminating the TiN film and the SiN film. The lamination number of each film is appropriately set according to the use or the like of the TiSiN film. Thus, by adjusting the lamination number of the TiN film and the SiN film, it is possible to form the TiSiN film having a Si content of 5 atom % to 20 atom %.

After forming the TiSiN film on one surface side of the wafer W by the method described above, the TiN film as an intermediate film (hereinafter, also referred to as a "TiN intermediate film") is formed on the TiSiN film. That is, as described in the gas supply sequence of FIG. 3, the $TiCl_4$ gas is supplied to be adsorbed on the wafer W (step 9), then purging with the $N_2$ gas is performed to remove the $TiCl_4$ gas remaining in the processing container 10 (step 10). Subsequently, the $NH_3$ gas is supplied to react with the $TiCl_4$ adsorbed on the wafer W to form the TiN intermediate film (step 11). Subsequently, purging with the $N_2$ gas is performed to remove the $NH_3$ gas remaining in the processing container 10 (step 12). By repeating steps 9 to 12 a set number of times such that the $TiCl_4$ gas and the $NH_3$ gas are alternately supplied to the wafer W, and causing these $TiCl_4$ and $NH_3$ to react with each other, the TiN intermediate film having a desired thickness is formed.

The wafer W having the TiSiN film and the TiN intermediate film formed on one surface side thereof in the first film forming apparatus 1 is transferred to the second film forming apparatus 5 in which a tungsten film is formed on the TiN intermediate film. In this example, in the second film forming apparatus 5, tungsten chloride is reduced with hydrogen to form the tungsten film by an ALD method. An example of this tungsten film forming method will be described with reference to a gas supply sequence of FIG. 4.

Figure 4:
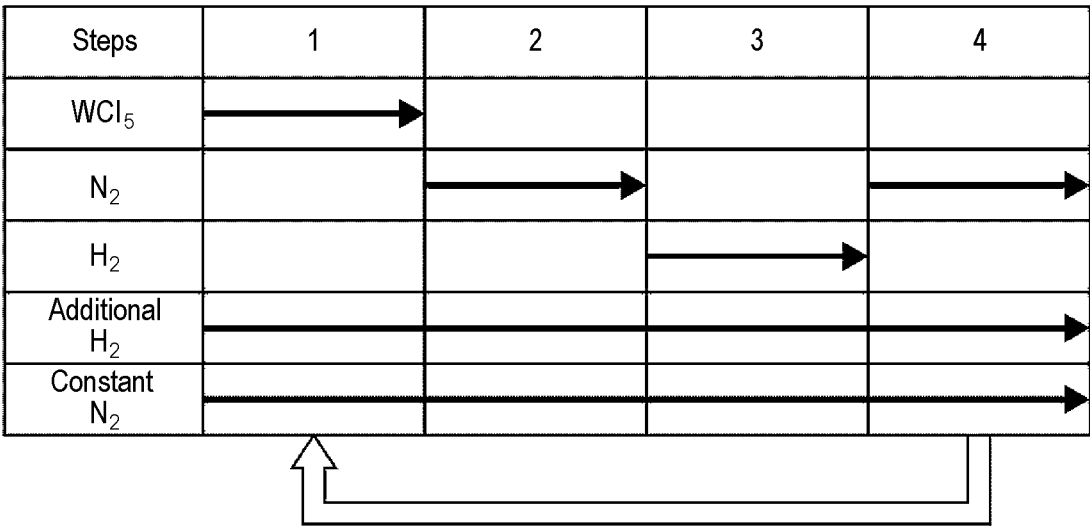
FIG. 4 is a view illustrating an example of the gas supply sequence in the film forming method according to the first embodiment.

The gas supply sequence of FIG. 4 illustrates supply timings of the $WCl_5$ gas, the $H_2$ gas, and the $NH_3$ gas used for film formation, and the $N_2$ gas, which is a purge gas for these gases, to the processing container 10. In FIG. 4, purge $N_2$ gases supplied from the source 63 for purging $WCl_5$ and the source 64 for purging the $H_2$ gas are collectively indicated as $N_2$. These purge $N_2$ gases are purge gases which are intermittently supplied. In addition, constant purge $N_2$ gases supplied from the source 66 for purging $WCl_5$ and the source 67 for purging the $H_2$ gas are collectively indicated as constant $N_2$. In addition, additional $H_2$ described in the gas supply sequence is a $H_2$ gas supplied from the source 65 in order to promote the reduction reaction of $WCl_5$ against the influence of the TiSiN film that makes the growth of tungsten film difficult.

In this film forming process, the wafer W having the TiSiN film and the TiN intermediate film formed in this order from the bottom on one surface side thereof is carried into the processing container 10 of the second film forming apparatus 5 and placed on the stage 2. Then, heating of the wafer W by the heater 21 is initiated, and the interior of the processing container 10 is evacuated by the vacuum evacuation part 17. The processing container 10 is constantly supplied with the $N_2$ gas from the sources 63 and 64 and the additional $H_2$ gas from the source 65 during a tungsten film forming process, which will be described later.

Thereafter, based on the gas supply sequence of FIG. 4, the $WCl_5$ gas is supplied to be adsorbed on the wafer W (step 1). Subsequently, purging with the $N_2$ gas is performed to remove the $WCl_5$ gas remaining in the processing container 10 (step 2). Subsequently, the $H_2$ gas is supplied to react with $WCl_5$ adsorbed on the wafer W, so that $WCl_5$ is reduced with $H_2$ to form a tungsten film (step 3). Subsequently, purging with the $N_2$ gas is performed to remove the $H_2$ gas remaining in the processing container 10 (step 4). In this way, steps 1 to 4 are repeated a set number of times to form a tungsten film having a desired thickness. Process conditions for the process of forming this tungsten film are, for example, as follows: the internal pressure of the processing container 10 is $3.99 \times 10^3$ Pa to $6.66 \times 10^3$ Pa (30 Torr to 50 Torr), and a wafer temperature is 400 degrees C. to 550 degrees C. In addition, the number of cycles in which the $WCl_5$ gas and the $H_2$ gas are alternately supplied is 10 to 200, for example, 100.

Figure 5:
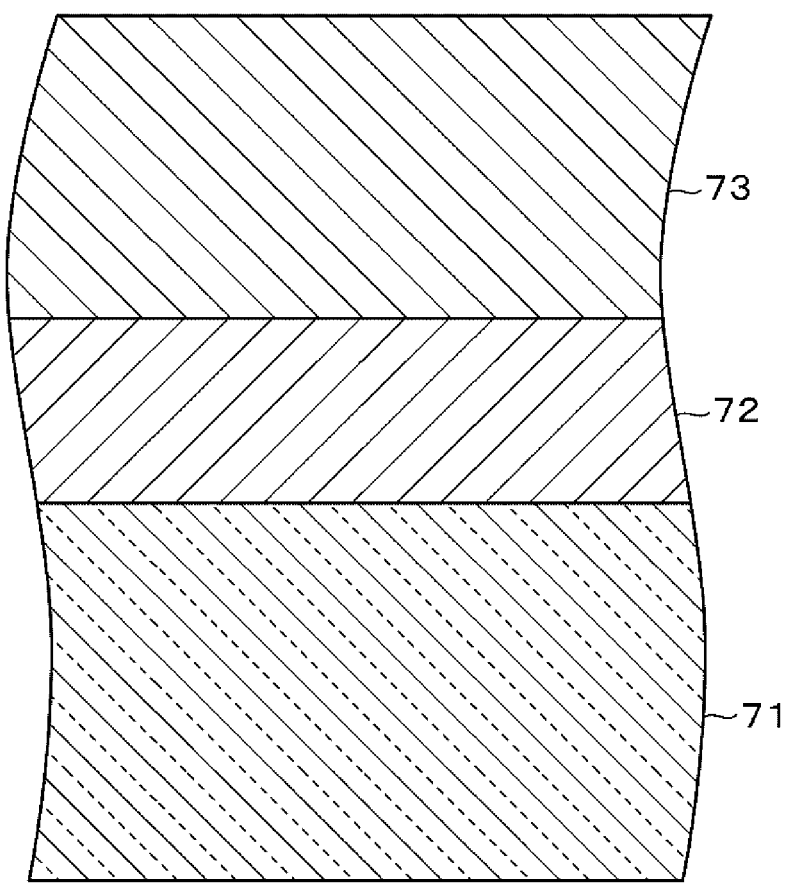
FIG. 5 is a vertical cross-sectional view illustrating an example of a laminated structure including a tungsten film formed by the film forming method according to the first embodiment.

A laminated structure including the tungsten film configured as described above is illustrated in FIG. 5. In FIG. 5, reference numeral 71 indicates the TiSiN film, reference numeral 72 indicates the TiN intermediate film, and reference numeral 73 indicates the tungsten film. The TiSiN film 71 is in a state in which Ti, Si, and N are mixed as described above.

A transistor such as a MOSFET is exemplified as a semiconductor device having the laminated structure including such a tungsten film. For example, hafnium oxide ($HfO_2$) is used as an oxide film in the gate region, a TiSiN film is used as a gate metal, and a tungsten film is used as a wiring layer. By using the TiSiN film as the gate metal, it is possible to regulate the work function of $HfO_2$ having a high dielectric constant, and thus to form a device with good electrical characteristics.

According to this embodiment, since the TiN intermediate film is formed on the TiSiN film and the tungsten film made of tungsten chloride is formed on the upper layer of the TiN intermediate film, it is possible to promote the formation of the tungsten film. Promoting the formation of the tungsten film means that the tungsten film is easily grown in a wafer plane so as to be formed with good uniformity in the wafer plane.

In adopting the TiSiN film as a gate metal, the present inventors have obtained a knowledge that poor film formation may be caused since the tungsten film formed by reducing the tungsten chloride with the $H_2$ gas is not likely to grow on the TiSiN film. It has been found that, in the tungsten film formed by the above-described method, the poor film formation is improved by forming the film on a TiN film having a certain thickness, so that good electrical characteristics are maintained even if the TiSiN film is used as an intermediate film and the TiN film is formed on the TiSiN film. Therefore, the present inventors have found a technique for promoting the formation of the tungsten film by forming the TiN film as an intermediate film (TiN intermediate film) on the TiSiN film.

The easiness of growth of the tungsten film varies depending on the Si content in the TiSiN film. As the Si content increases, the tungsten film tends to be difficult to grow. Therefore, although it also depends on the Si content in the TiSiN film, the thickness of the TiN intermediate film may be 8 Å or more, as will be apparent from the examples to be described later. Considering restrictions on film thickness and electrical characteristics associated with miniaturization of semiconductor devices, the thickness of the TiN intermediate film may be 20 Å or less. In the laminated structure of FIG. 5, for example, the thicknesses of respective films are as follows: the TiSiN film 71 has a thickness of 27 Å, the TiN intermediate film 72 has a thickness of 13 Å, and the tungsten film 73 has a thickness of 34 Å.

Second Embodiment

This embodiment is an example in which an initial tungsten film is formed as an intermediate film in place of the TiN film described above. The initial tungsten film refers to a film formed under conditions in which a supply ratio of hydrogen to tungsten chloride is higher than a supply ratio of hydrogen to tungsten chloride when forming the tungsten film. In this example, the initial tungsten film and the tungsten film are formed by the second film forming apparatus 5 illustrated in FIG. 2. The intermediate-film forming gas supply part is configured with a tungsten chloride supply part and a hydrogen supply part in the second film forming apparatus 5.

The controller 101 in this example is configured to control the tungsten chloride supply part and the hydrogen supply part when forming the initial tungsten film and the tungsten film. In addition, the controller 101 is configured to perform a control for forming the initial tungsten film under a condition in which the supply ratio of hydrogen to tungsten chloride is higher than the supply ratio of hydrogen to tungsten chloride when forming the tungsten film. More specifically, when forming the tungsten film, the supply ratio is set to a value of less than 6, specifically, a value within the range of 1 or more and less than 6. Meanwhile, the controller is configured to perform control such that, when forming the initial tungsten film, the supply ratio is a value of 6 or more, specifically, a value within the range of 6 or more and 200 or less.

The supply ratio of hydrogen to tungsten chloride is a mass-based ratio of the supply amount of the $WCl_5$ gas and the supply amount of the $H_2$ gas in this example. Specifically, the supply ratio is a value obtained by (the mass of $H_2$)/(the mass of $WCl_5$) from the mass of $WCl_5$ and the mass of $H_2$ supplied to the processing container 10. For $WCl_5$, a relationship between variables, such as the heating temperature of the raw material tank (not illustrated), the residual amount of $WCl_5$ in the raw material tank, the flow rate of the carrier gas supplied to the raw material tank, and the mass of $WCl_5$ contained in a mixed gas of $WCl_5$ gas and a carrier gas is acquired, and the mass of $WCl_5$ is obtained from these variables. In addition, the mass of $H_2$ is obtained from the flow rate of the $H_2$ gas for reduction supplied from the source 62 to the processing container 10.

The controller 101 is configured to alternately supply $WCl_5$ and $H_2$ to the wafer W to form the tungsten film and the initial tungsten film by the ALD method. The controller is configured to execute control of forming the initial tungsten within the range of 10 to 100 cycles of alternately supplying $WCl_5$ and $H_2$.

An example of the film forming method of this embodiment will be described with reference to gas supply sequences illustrated in FIGS. 6 and 7. In this example, a TiSiN film is formed in the first film forming apparatus 1 based on the gas supply sequence illustrated in FIG. 6. Subsequently, an initial tungsten film and a tungsten film are formed in the second film forming apparatus 5 based on the gas supply sequence of FIG. 7.

Figure 6:
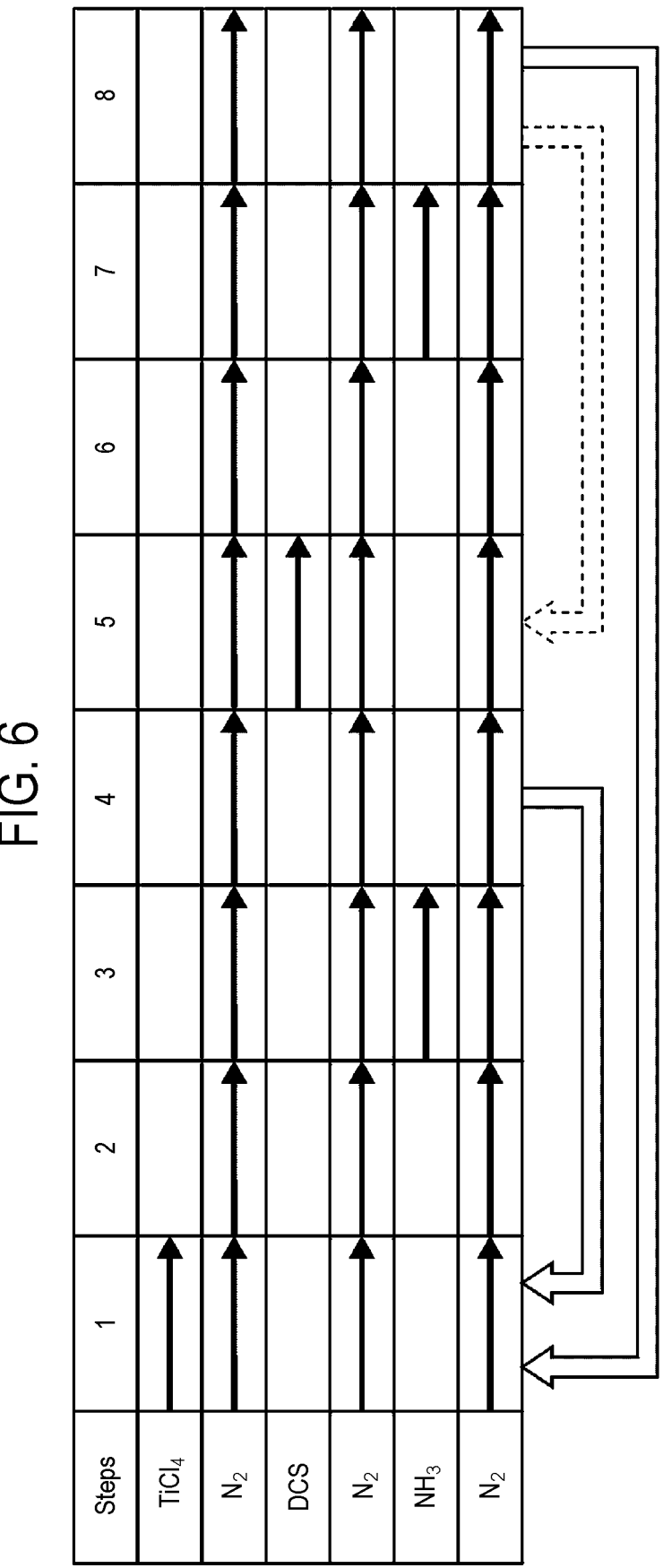
FIG. 6 is a view illustrating an example of a gas supply sequence in a film forming method according to a second embodiment.

The gas species described in FIG. 6 are the same as those in the gas supply sequence (steps 1 to 8) when forming the TiSiN film illustrated in FIG. 3, and the gas species described in FIG. 7 are the same as those in the gas supply sequence in FIG. 4. In FIG. 7, the thick arrow of the $H_2$ gas indicates that the supply ratio of $H^2$ is high.

In this film forming process, first, the wafer W is carried into the processing container 10 of the first film forming apparatus 1, and the $TiCl_4$ gas and the $NH_3$ gas are alternately supplied to the wafer W to form a TiSiN film. This TiSiN film is formed by the same method as that in the first embodiment according to the gas supply sequence illustrated in FIG. 6. That is, steps 1 to 4 are repeated a set number of times, for example, 19 times to form a TiN film. Subsequently, steps 5 to 8 are performed a set number of times, for example, once to form a SiN film on the TiN film. A TiSiN film is obtained by repeating the formation of the TiN film and the SiN film a set number of times.

After the TiSiN film is formed on one surface side of the wafer W in this way, the wafer W is transferred to the processing container 10 of the second film forming apparatus 5, and processes of forming an initial tungsten film as an intermediate film and a tungsten film are performed. Specifically, a description will be made with reference to the gas supply sequence of FIG. 7. In the same gas supply sequence, the initial tungsten film is formed in steps 1 to 4, and the tungsten film is formed in steps 5 to 8.

In this film forming process as well, the wafer W placed on the stage 2 of the processing container 10 is heated by the heater 21 and the interior of the processing container 10 is evacuated by the vacuum evacuation part 17. The processing container 10 is constantly supplied with the $N_2$ gas from the sources 66 and 67 and constantly supplied with additional $H_2$ gas from the source 65 during the film forming processes of the initial tungsten film and the tungsten film.

The initial tungsten film is formed by repeating supplying of the $WCl_5$ gas in step 1, purging with the $N_2$ gas in step 2, supplying of the $H_2$ gas in step 3, purging with the $N_2$ gas in step 4, and reducing of $WCl_5$ with $H_2$, as illustrated in FIG. 7.

At this time, in the supplying of the $H_2$ gas in step 3, the tungsten film is formed under a condition in which the supply ratio of $H_2$ to $WCl_5$ is higher than the supply ratio of $H_2$ to $WCl_5$ when forming the tungsten film. Specifically, the supply ratio of $WCl_5$ and $H_2$ is a value of 6 or more, specifically a value within the range of 6 or more and 200 or less, as described above.

After forming the initial tungsten film having a desired thickness in this way, the formation of the tungsten film is performed according to steps 5 to 8.

The tungsten film is formed by repeating the supplying of the $WCl_5$ gas in step 5, the purging with the $N_2$ gas in step 6, the supplying of the $H_2$ gas in step 7, the purging with the $N_2$ gas in step 8, and by the reducing of the $WCl_5$ gas with $H_2$. As described above, the supply ratio of $WCl_5$ and $H_2$ when forming the tungsten film is a value of less than 6, specifically a value within the range of 1 or more and less than 6.

Process conditions for the processes of forming the initial tungsten film and the tungsten film are, for example, as follows: the internal pressure of the processing container 10 is $3.99×10^3$ Pa to $6.66×10^3$ Pa (30 Torr to 50 Torr), and the wafer temperature is 400 degrees C. to 550 degrees C.

Figure 8:
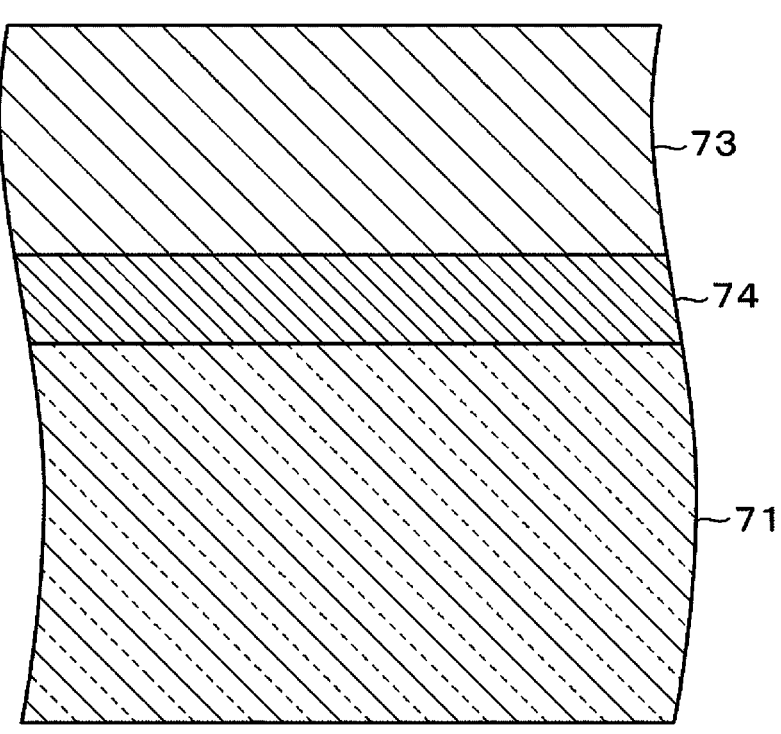
FIG. 8 is a vertical cross-sectional view illustrating an example of a laminated structure including a tungsten film formed by the film forming method according to the second embodiment.

A laminated structure including the tungsten film configured in this way is illustrated in FIG. 8. In FIG. 8, reference numeral 71 indicates a TiSiN film, reference numeral 74 indicates an intermediate film using an initial TiN film, and reference numeral 73 indicates a tungsten film.

According to this embodiment, the initial tungsten film is formed in a state in which the reducing power of $WCl_5$ is enhanced by a high concentration of $H_2$ under a condition in which the supply ratio of $H_2$ to $WCl_5$ is high. Therefore, it is possible to increase the amount of tungsten film formed on the TiSiN film per unit time compared to that in the case in which the tungsten film is formed with a normal supply amount of $H_2$. Once the initial tungsten film is formed to have a certain thickness on the TiSiN film, the phenomenon in which the tungsten film becomes difficult to grow on the initial tungsten film is not observed. As a result, it is possible to promote the formation of the tungsten film compared with the case in which the tungsten film is formed on the TiSiN film.

In forming the tungsten film on the TiSiN film by reducing $WCl_5$ with $H_2$, since the supply ratio of $H_2$ to $WC_5$ in the related art causes poor formation of the tungsten film, the present embodiment is intended to optimize the supply ratio. In this method, after the initial tungsten film is formed, the rest of the tungsten film is formed under a condition in which the supply amount of $H_2$ gas is reduced. Thus, there is also an advantage in that an increase in consumption of the $H_2$ gas can be suppressed.

The initial tungsten film is formed by alternately supplying the $WCl_5$ gas and the $H_2$ gas, and the thickness is determined by the number of cycles of alternately supplying the $WCl_5$ gas and the $H_2$ gas. When the initial tungsten film has a certain thickness, it is possible to suppress the influence of the TiSiN film, which makes it difficult to grow the tungsten film. Thus, a case in which the number of cycles of alternately supplying the $WCl_5$ gas and the $H_2$ gas is in the range of 10 to 100 may be exemplified. Furthermore, the number of cycles of alternately supplying the $WCl_5$ gas and the $H_2$ gas during the formation of the tungsten film is in the range of 1 to 200 cycles, for example, 100 cycles.

Third Embodiment

In this embodiment, in order to promote the formation of the tungsten film, the entire tungsten film is formed under the condition in which the supply ratio of hydrogen to tungsten chloride is a value of 6 or more, specifically a value within the range of 6 or more and 200 or less (the same condition as the initial tungsten film described above). This tungsten film is formed, for example, in the second film forming apparatus 5 illustrated in FIG. 2. The controller 101 in this example is configured to control the tungsten chloride supply part and the hydrogen supply part such that the tungsten film is formed under the condition of above-described supply ratios.

An example of the film forming method of this embodiment will be described with reference to the gas supply sequence illustrated in FIG. 9. In this example, after a TiSiN film is in the first film forming apparatus 1 first based on the gas supply sequence illustrated in FIG. 6, a tungsten film is formed in the second film forming apparatus 5 based on a gas supply sequence of FIG. 9. Gas species described in FIG. 9 are the same as those in the gas supply sequence of FIG. 4, and the thick arrow of the $H_2$ gas indicates that supply ratio of $H_2$ is high.

In this embodiment as well, as in the second embodiment, first, the wafer W is carried into the processing container 10 of the first film forming apparatus 1, and the $TiCl_4$ gas and the $NH_3$ gas are alternately supplied to the wafer W to form the TiSiN film. Then, after forming the TiSiN film on one surface side of the wafer W, the wafer W is transferred to the processing container 10 of the second film forming apparatus 5, and the tungsten film is formed on the TiSiN film.

In the second film forming apparatus 5, the wafer W placed on the stage 2 of the processing container 10 is heated by the heater 21 and the interior of the processing container 10 is evacuated by the vacuum evacuation part 17. The processing container 10 is constantly supplied with the $N_2$ gas from the sources 66 and 67 and constantly supplied with additional $H_2$ gas from the source 65 during the process of forming the tungsten film.

Figure 9:
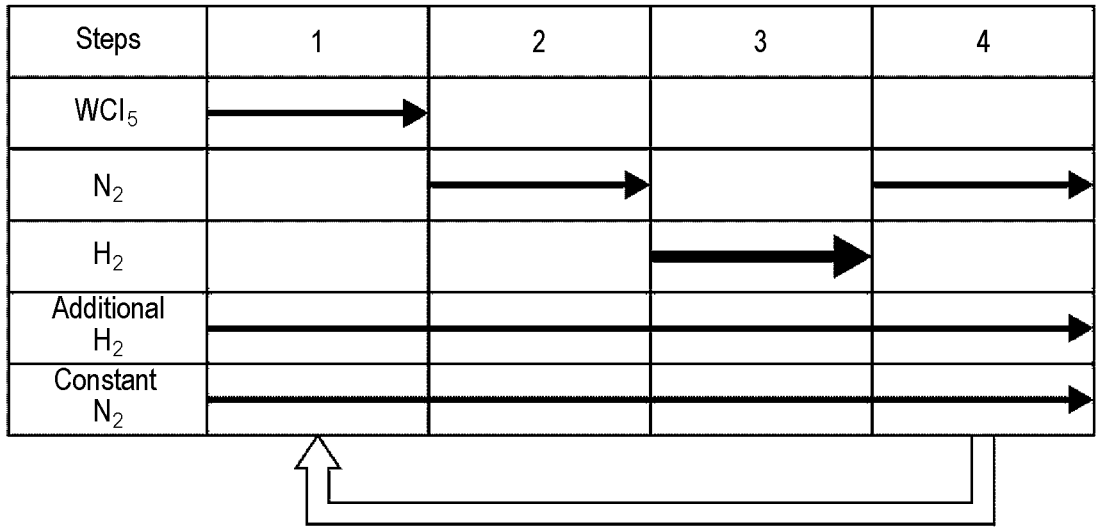
FIG. 9 is a view illustrating an example of a gas supply sequence in a film forming method according to a third embodiment.

The tungsten film is formed according to the gas supply sequence of FIG. 9. That is, the tungsten film is formed by repeating the supplying of the $WCl_5$ gas in step 2, the purging with the $N_2$ in step 2, the supplying of the $H_2$ gas in step 3, and the purging with the $N_2$ gas in step 4, and by reducing the $WCl_5$ gas with $H_2$. At this time, as described above, the tungsten film is formed under the condition in which the supply ratio of $H_2$ to $WCl_5$ is a value of 6 or more and thus the supply ratio of $H_2$ is high.

Process conditions for the process of forming this tungsten film are, for example, as follows: the internal pressure of the processing container 10 is $3.99 \times 10^3$ Pa to $6.66 \times 10^3$ Pa (30 Torr to 50 Torr), and the wafer temperature is 400 degrees C. to 550 degrees C. In addition, the number of cycles of alternately supplying the $WCl_5$ gas and the $H_2$ gas is 10 to 200 cycles, for example, 100 cycles.

Figure 10:
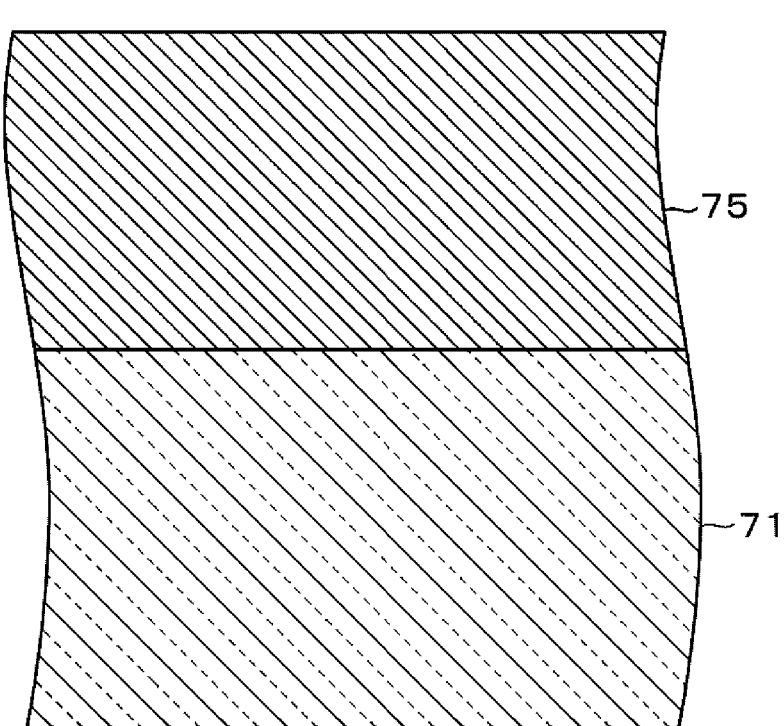
FIG. 10 is a vertical cross-sectional view illustrating an example of a laminated structure including a tungsten film formed by the film forming method according to the third embodiment.

A laminated structure including a tungsten film configured as described above is illustrated in FIG. 10. In FIG. 8, reference numeral 71 indicates a TiSiN film, and reference numeral 75 indicates a tungsten film. This tungsten film 75 is a tungsten film formed under the condition in which the supply ratio of $H_2$ to $WCl_5$ is higher than those in the tungsten films 73 of the first and second embodiments.

According to this embodiment, the entire tungsten film is formed in a state in which the supply ratio of $H_2$ to $WCl_5$ at the time of film formation is higher than those in the tungsten films 73 of the first and second embodiments, in other words the reducing power of $WCl_5$ is enhanced by a high concentration of $H_2$. Therefore, it is possible to increase the amount of tungsten film formed on the TiSiN film per unit time compared to that in the case in which the tungsten film is formed with a normal supply amount of $H_2$. In addition, since the tungsten film is formed directly on the TiSiN film, it is possible to suppress the total thickness from the bottom surface of the TiSiN film to the top surface of the tungsten film compared to the case in which the intermediate film is formed. Therefore, it is effective when semiconductor devices are miniaturized and the film thickness of the TiSiN film or the tungsten film is limited.

In the foregoing, the TiSiN film formed on one surface side of the wafer W has a Si content of 5 to 20 atom % depending on required electrical characteristics and the like, but it is understood that the higher the Si content in the TiSiN film, the more difficult it is to grow a tungsten film.

In this case, for example, the techniques of the first and second embodiments, or the techniques of the first and third embodiments may be combined.

For example, a TiN intermediate film may be formed on a TiSiN film by the method of the first embodiment, an initial tungsten film may be formed on the TiN intermediate film by the method of the second embodiment, and then a tungsten film may be formed. In addition, for example, the TiN intermediate film is formed on the TiSiN film by the method of the first embodiment, and the tungsten film may be formed on the TiN intermediate film by the method of the third embodiment under the condition in which the supply ratio of $H_2$ to $WCl_5$ is high.

In the first embodiment described above, an example in which the intermediate film and the tungsten film are formed in different film forming apparatuses has been illustrated, and in the second embodiment, an example in which the intermediate film and the tungsten film are formed in the same film forming apparatus has been illustrated. In the first embodiment as well, the intermediate film and the tungsten film may be formed in the same film forming apparatus. In addition, the TiSiN film, the intermediate film, and the tungsten film may be formed by the same film forming apparatus, or respective films may be formed in different film forming apparatuses. In the above-described embodiment, the film forming process for forming a TiSiN film on the wafer W has been described, but it is not always necessary to form the TiSiN film. The wafer W having a TiSiN film, which has been formed in advance by another apparatus, may be transferred to the processing container 10 to form an intermediate film or a tungsten film on the TiSiN film. In addition, the TiN intermediate film, the initial tungsten film, and the tungsten film may be formed by chemical vapor deposition (CVD) instead of ALD.

The embodiments disclosed herein should be considered to be exemplary in all respects and not restrictive. The embodiments described above may be omitted, replaced, or modified in various forms without departing from the scope and spirit of the appended claims.

Examples

Evaluation Experiment 1

Figure 11:
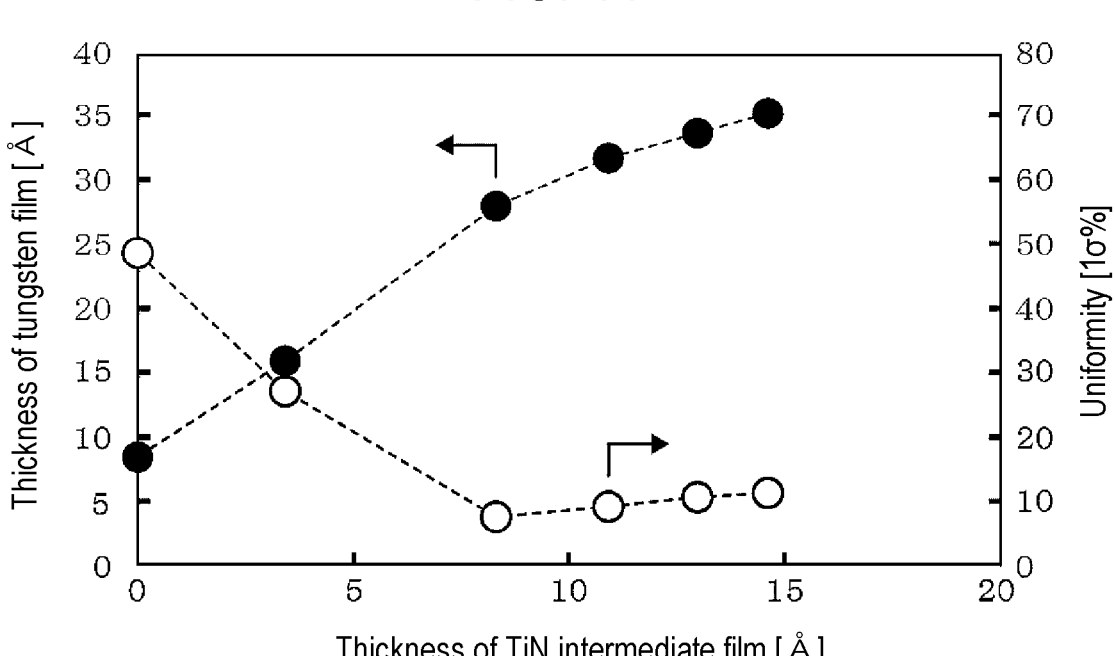
FIG. 11 is a characteristic diagram showing an evaluation result of the film forming method.

An evaluation experiment of the first embodiment of the present disclosure will be described. FIG. 11 shows results obtained by forming the TiSiN film, the TiN intermediate film, and the tungsten film by the method of the first embodiment, and measuring the thickness and uniformity of the tungsten film. The TiSiN film and the TiN intermediate film were formed according to the gas supply sequence described in the first embodiment under the condition in which the wafer temperature is 400 degrees C. The thickness of the TiSiN film was 27 Å, and the Si content of the TiSiN film was 5 atom %.

The tungsten film was formed according to the gas supply sequence described in the first embodiment under the condition in which the wafer temperature is 440 degrees C., and the number of cycles of alternately supplying the $WCl_5$ gas and the $H_2$ gas was 100.

The TiN intermediate films were formed while changing the number of cycles of alternately supplying the $TiCl_4$ gas and the $NH_3$ gas from 0 to 25, the tungsten film was formed on each TiN intermediate film, and the thicknesses (Å) and the uniformity (1σ%=(standard deviation σ/average value)× 100%) of the tungsten films was measured. The thickness of the tungsten film is an average value of measured values at a plurality of points within the plane of the wafer W. The uniformity was calculated based on this thickness data, wherein a lower number indicates better uniformity.

In FIG. 11, the horizontal axis represents the thickness (Å) of the TiN intermediate film, the left vertical axis indicates the thickness (Å) of the tungsten film, and the right vertical axis represents the uniformity (1σ%), wherein the black circle plots (○) indicate thickness data, and the white circle plots (○) indicate uniformity data. As a result of each experiment, when the numbers of cycles of alternately supplying the $TiCl_4$ gas and the $NH_3$ gas were 5, 10, 15, 20, and 25, the thicknesses of the TiN intermediate films were 3.4 Å, 8.3 Å, 10.9 Å, 12.9 Å, and 14.6 Å, respectively.

From these results, it was confirmed that the thickness of the tungsten film is 8.7 Å when the TiN intermediate film is not formed on the TiSiN film, whereas the thickness of the tungsten film increases as the thickness of the TiN intermediate film increases. From this, it is recognized that, when forming a tungsten film made of $WCl_5$ on an upper layer of a TiSiN film, the formation of the tungsten film is promoted by forming a TiN intermediate film on the TiSiN film. It was also confirmed that, when the thickness of the TiN intermediate film is 8.3 Å or more, the uniformity of the formed tungsten film is good. According to these evaluation results, it is understood that, when the thickness of the TiN intermediate film is 8 Å or more, the thickness of the formed tungsten film is close to 30 Å, which makes it possible to promote the formation of the tungsten film, and thus to form the tungsten film with good uniformity.

Evaluation Experiment 2

An Evaluation Experiment of the Third Embodiment of the Present Disclosure Will be described. The TiSiN film, the initial tungsten film, and the tungsten film were formed by the method of the third embodiment, and the thickness and uniformity of the tungsten film were measured. The TiSiN film was formed according to the gas supply sequence described in the third embodiment under the condition in which the wafer temperature is 400 degrees C. The thickness of the TiSiN film was 27 Å, and the Si content of the TiSiN film was 5 atom %.

The tungsten film was formed according to the gas supply sequence described in the third embodiment under the condition in which the wafer temperature is 440 degrees C., and the number of cycles of alternately supplying the $WCl_5$ gas and the $H_2$ gas was 100.

In addition, the tungsten films were formed while changing the supply ratio of the $WCl_5$ gas and the $H_2$ gas, and the thickness (Å) and uniformity (1σ %) of each tungsten film were measured by the same method as in Evaluation Experiment 1.

As described above, the supply ratio was obtained by calculating (the mass of $H_2$)/(the mass of $WCl_5$) from the mass of $WCl_5$ and the mass of $H_2$ supplied to the processing container 10.

Hereinbelow, for five samples with different supply ratios, the flow rates of the carrier gas ($N_2$ gas) of $WCl_5$ and the flow rates of the $H_2$ gas, the supply ratios obtained from these, the thicknesses and uniformities of the formed tungsten films are listed.

Sample 1: supply ratio 4.13 ($N_2$ 800 sccm, $H_2$ 5,000 sccm), thickness 8.7 Å, uniformity 49.1%

Sample 2: supply ratio 7.32 ($N_2$ 250 sccm, $H_2$ 5,000 sccm), thickness 19.2 Å, uniformity 21.9%

Sample 3: supply ratio 8.27 ($N_2$ 800 sccm, $H_2$ 10,000 sccm), thickness 33.1 Å, uniformity 21.4%

Sample 4: supply ratio 7.44 ($N_2$ 800 sccm, $H_2$ 9,000 sccm), thickness 27.5 Å, uniformity 27.2%

Sample 5: supply ratio 13.17 ($N_2$ 250 sccm, $H_2$ 9,000 sccm), thickness 36.5 Å, uniformity 11.5%

Sample 2 was fabricated in a condition in which, with respect to the condition of Sample 1, the supply ratio of $H_2$ was relatively increased in the above supply ratio by reducing the flow rate of the carrier gas of $WCl_5$ without changing the flow rate of $H_2$. By comparing these measurement results, it is recognized that by increasing the supply ratio of $H_2$ in the above supply ratio, the thickness of the formed tungsten film is doubled or more, and the uniformity is also improved. Therefore, it is understood that relatively increasing the supply ratio of $H_2$ increases the reducing power of $H_2$ and promotes the formation of the tungsten film.

Samples 3 and 4 were fabricated in the conditions that, with respect to the conditions of Sample 1, the supply ratios of $H_2$ were relatively increased in the above supply ratio by increasing the flow rates of $H_2$ without changing the flow rate of the carrier gas of $WCl_5$. From these comparisons, it was recognized that by increasing the supply ratios of $H_2$ in the above supply ratio, the thicknesses of the formed tungsten films are greatly increased, and good uniformities are obtained. In Samples 3 and 4, it is presumed that the formation of the tungsten films was further promoted since the supplied amounts of $WCl_5$ were large.

Sample 5 was fabricated in the condition with the highest supply ratio of $H_2$. From the results of this evaluation experiment, it was recognized that the larger the supply ratio of $H_2$ to $WCl_5$, the thicker the tungsten film, and the better the uniformity.

However, when the supply ratio of $H_2$ to $WCl_5$ is a certain level or higher, the thickness and uniformity of the obtained tungsten film do not change so much thereafter. From this point of view, there is no critical upper limit to increasing the supply ratio of $H_2$, but, for example, $WCL_5$ may be supplied at a flow rate of 5 to 200 mg/min and $H_2$ may be supplied at a flow rate of 200 to 900 mg/min. Therefore, it may be exemplified that the supply ratio is up to about 200.

Meanwhile, considering the effects of the supply ratio on the thickness and uniformity of the tungsten film in samples 2 to 4, it is considered that, when the supply ratio is 6 or higher, it is possible to obtain a tungsten film having a thickness of about 30 Å while maintaining the uniformity.

From these examination results, it is preferable to form the tungsten film under the condition in which the supply ratio of $H_2$ to $WCl_5$ is a value within the range of 6 or more and 200 or less.

In addition, it has been found that, although the tungsten film is difficult to grow on the TiSiN film as described above, after forming the tungsten film with a high supply ratio of $H_2$ as the initial tungsten film, the TiSiN film is less likely to affect the inhibition of formation of the tungsten film even if the supply ratio of $H_2$ is reduced. From this point of view, after the initial tungsten film is formed, it becomes possible to form the tungsten film even if the supply ratio of $H_2$ is less than the minimum supply ratio (=6) required for forming the initial tungsten film. Here, in forming a normal tungsten film after forming the initial tungsten film, there is no lower limit to the supply ratio of $H_2$ as long as the tungsten film can be formed. However, as described above, there may be the case in which $WCL_5$ is supplied at a flow rate of 5 to 200 mg/min and $H_2$ is supplied at a flow rate of 200 to 900 mg/min. Therefore, as a preferred range of the supply ratio when forming the normal tungsten film, a value within the range of 1 or more and less than 6 is exemplified as the preferred range.

In addition, when the initial tungsten film is formed within the range of 10 to 100 cycles of alternately supplying $WCl_5$ and $H_2$, it is possible to secure a thickness that promotes the formation of a tungsten film in a subsequent process.

Evaluation Experiment 3

Figure 12:
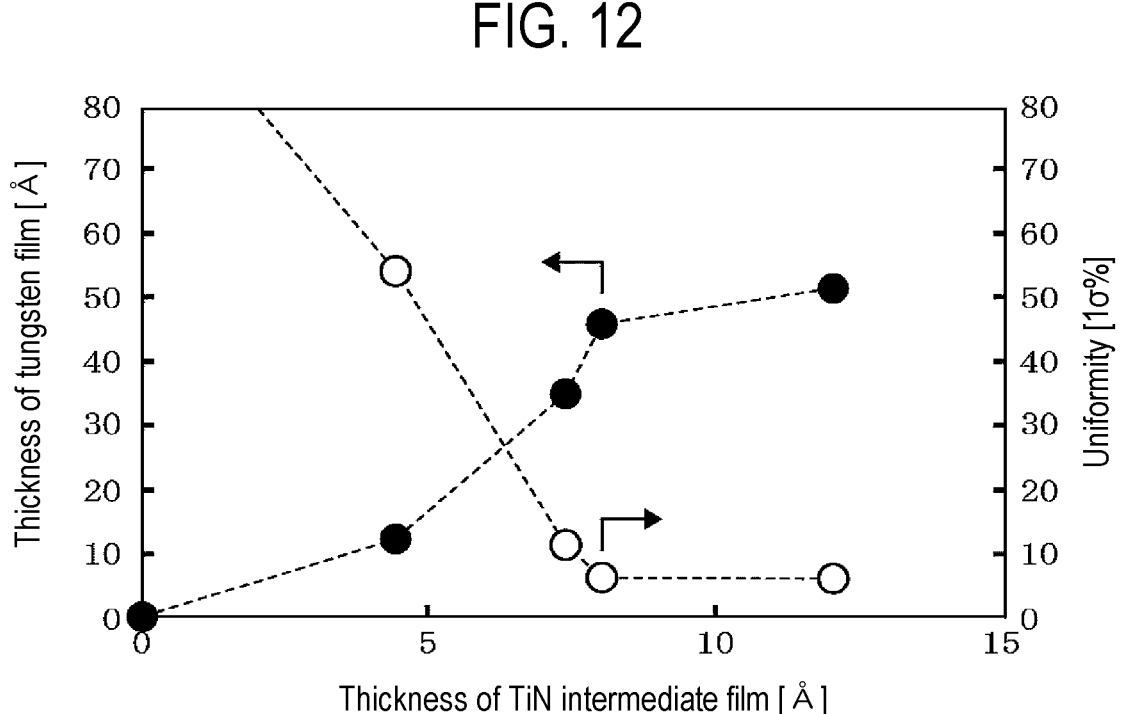
FIG. 12 is a characteristic diagram showing an evaluation result of the film forming method.

Evaluation Experiment 3 is an experiment regarding the formation of the tungsten film when the Si content in the TiSiN film is high. FIG. 12 shows results obtained by forming a TiSiN film, a TiN intermediate film, and a tungsten film and measuring the thickness and uniformity of the tungsten film. The TiSiN film was formed according to the gas supply sequence illustrated in FIG. 3 under the condition in which the wafer temperature is 400 degrees C. When the TiSiN film is formed by forming the SiN film on the TiN film by performing steps 1 to 8 once, the TiSiN film of this example was formed by repeating the above-described steps 1 to 8 10 times. The thickness of the TiSiN film was 11 Å, and the Si content of the TiSiN film was 19.2 atom %.

The tungsten film was formed according to the gas supply sequence of FIG. 9 under the condition in which the wafer temperature is 440 degrees C., the supply ratio of $WCl_5$ and $H_2$ was 13.7, and the number of cycles of alternately supplying the $WCl_5$ gas and the $H_2$ gas was 100.

TiN intermediate films were formed while changing the number of cycles of alternately supplying $TiCl_4$ and $NH_3$ from 0 to 15, the tungsten film was formed on each TiN intermediate film, and the thickness (Å) and uniformity (1σ%) of the tungsten film was measured in the same manner as in Evaluation Experiment 1.

In FIG. 12, the horizontal axis represents the thickness (Å) of the TiN intermediate film, the left vertical axis indicates the thickness (Å) of the tungsten film, and the right vertical axis represents the uniformity (1σ%), wherein the black circle plots (O) indicate thickness data, and the white circle plots (o) indicate uniformity data. When the numbers of cycles of alternate supply were 5, 8, 10, and 15, the thicknesses of the TiN intermediate films were 4.4 Å, 7.4 Å, 8.0 Å, and 12.0 Å, respectively.

As illustrated in FIG. 12, it was recognized that the thickness of the tungsten film increases as the thickness of the TiN intermediate film increases, and when the thickness of the TiN intermediate film is 7.4 Å or more, the thickness of the tungsten film is 34.0 Å. It was also confirmed that the uniformity is good when the thickness of the TiN intermediate film is 7.4 Å or more. As a result, it was also recognized that, even when the Si content of the TiSiN film is as high as 19.2%, by forming the TiN intermediate film on the TiSiN film and further forming the TiN intermediate film under the condition in which the supply ratio of $H_2$ is high, there is an action to promote the formation of the tungsten film. According to these evaluation results, it is understood that, when the thickness of the TiN intermediate film is 7 Å or more, the thickness of the tungsten film is 30 Å or more, which makes it possible to promote the formation of the tungsten film, and thus to form the tungsten film with good uniformity.

Evaluation Experiment 4

Figure 13:
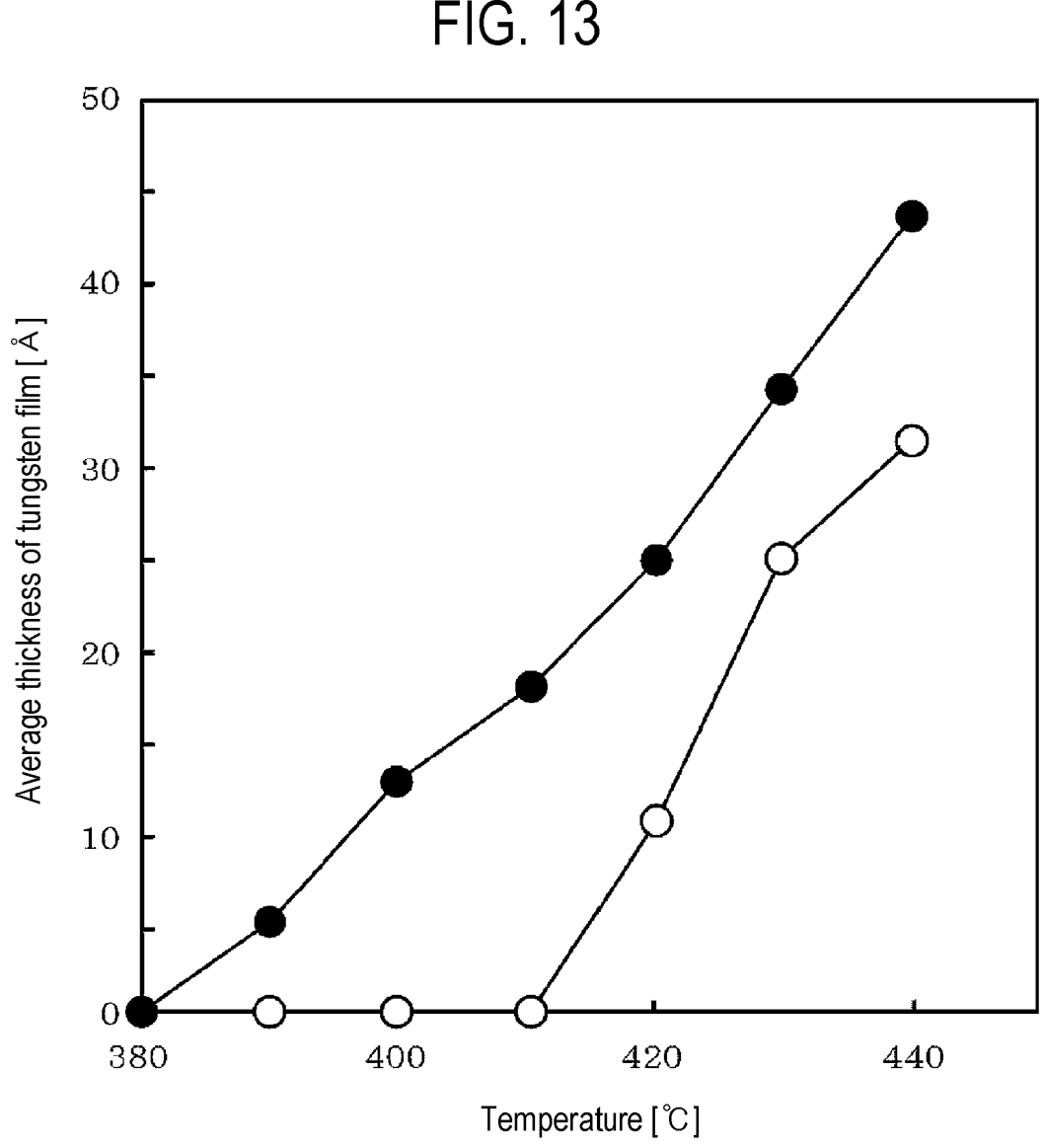
FIG. 13 is a characteristic diagram showing an evaluation result of the film forming method.

An evaluation experiment of the third embodiment of the present disclosure will be described. FIG. 13 is a characteristic diagram showing a relationship between the thickness and film forming temperature of the tungsten film. In this evaluation experiment, the TiN intermediate film was formed on the semiconductor wafer W, the tungsten film was formed on the TiN intermediate film, and the thickness of the tungsten film was measured. The TiN intermediate film was formed by repeating, 50 times, steps 9 to 12 in the gas supply sequence of FIG. 3 under the condition in which the wafer temperature is 440 degrees C.

The tungsten film was formed according to the gas supply sequence described in the third embodiment under the high-concentration $H_2$ condition in which the supply ratio of $WCl_5$ and $H_2$ is 14.1 and the supply ratio of $H_2$ is high, and the number of cycles of alternately supplying $WCl_5$ and $H_2$ was 88. Under these conditions, the film forming process was performed while changing the wafer temperature, and the thickness of each tungsten film was measured. In addition, as a comparative example, a tungsten film was formed under the low-concentration $H_2$ condition in which the supply ratio of $WCl_5$ and $H_2$ is 4.96 and the supply ratio of $H_2$ is low, and the same evaluation was performed.

These results are shown in FIG. 13. In FIG. 13, the horizontal axis represents a temperature (° C.), the vertical axis represents the thickness of the tungsten film (Å), the black circle plots (○) indicate the data obtained under the high-concentration $H_2$ condition, and the white circle plots (○) indicate data obtained under the low-concentration $H_2$ condition.

As shown in FIG. 13, it was recognized that, under the low-concentration $H_2$ condition, since it is impossible to form a tungsten film when the film formation temperature is lower than 420 degrees C., the lower limit of the film formation temperature is 420 degrees C., and under the high-concentration $H_2$ condition, the lower limit of the film forming temperature is 390 degrees C. In this evaluation experiment, the tungsten film was not formed on the upper layer of the TiSiN film, but it was confirmed that there is a correlation between the $H_2$ concentration and the film forming temperature at the time of reducing tungsten chloride with hydrogen to form a tungsten film.

This Evaluation Experiment 3 suggests that it is possible to decrease the film forming temperature by increasing the supply ratio of $H_2$ in the supply ratio of $WCl_5$ and $H_2$ when forming the tungsten film. In a transistor of a semiconductor device, it may be requested to lower a processing temperature during a film forming process in order to suppress the diffusion of metal from the metal wiring layer and to suppress thermal damage to other films constituting the semiconductor device. Therefore, it can be said that it is effective to increase the supply ratio of $H_2$ when forming a tungsten film at a lower temperature.

EXPLANATION OF REFERENCE NUMERALS

10: processing container, 41: titanium-containing gas source, 43: nitrogen-containing gas source, 61: tungsten chloride source, 62: hydrogen source, 71: TiSiN film, 72: TiN intermediate film, 73: tungsten film, 100: controller

What is claimed is:

1. A method of forming a tungsten film on a substrate, the method comprising:

forming, on an upper layer side of a titanium silicon nitride film formed on one surface side of the substrate, an intermediate film for promoting formation of the tungsten film using tungsten chloride; and forming the tungsten film on an upper layer side of the intermediate film by using a gas of the tungsten chloride, wherein the intermediate film is a titanium nitride film.

2. The method of claim 1, wherein the titanium nitride film is obtained by alternately supplying a titanium-containing gas and a nitrogen-containing gas to the substrate and causing the titanium-containing gas and the nitrogen-containing gas to react with each other.

* * * * *